United States Patent
Nakamura

(10) Patent No.: US 9,479,137 B2
(45) Date of Patent: Oct. 25, 2016

(54) FILTER DEVICE AND DUPLEXER INCLUDING COMPENSATION CIRCUIT

(71) Applicant: Murata Manufacturing Co., Ltd., Nagaokakyo-shi, Kyoto-fu (JP)

(72) Inventor: Soichi Nakamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/641,597

(22) Filed: Mar. 9, 2015

(65) Prior Publication Data

US 2015/0180438 A1 Jun. 25, 2015

Related U.S. Application Data

(63) Continuation of application No. PCT/JP2013/067535, filed on Jun. 26, 2013.

(30) Foreign Application Priority Data

Sep. 24, 2012 (JP) ................. 2012-209828

(51) Int. Cl.
  *H03H 7/46* (2006.01)
  *H03H 7/01* (2006.01)
  *H03H 7/42* (2006.01)
  *H03H 9/00* (2006.01)
  *H03H 9/70* (2006.01)
  *H03H 7/12* (2006.01)

(52) U.S. Cl.
  CPC .............. *H03H 7/0115* (2013.01); *H03H 7/12* (2013.01); *H03H 7/42* (2013.01); *H03H 7/463* (2013.01); *H03H 9/0023* (2013.01); *H03H 9/70* (2013.01); *H03H 7/1758* (2013.01)

(58) Field of Classification Search
  CPC .. H03H 9/0561; H03H 9/6436; H03H 9/059; H03H 7/0115; H03H 7/12; H03H 7/42; H03H 7/463; H03H 9/0023; H03H 9/70; H03H 7/1758

USPC ................................................ 333/132, 195
See application file for complete search history.

(56) References Cited

U.S. PATENT DOCUMENTS

| | | |
|---|---|---|
| 2010/0060372 A1 | 3/2010 | Funahashi et al. |
| 2010/0150075 A1 | 6/2010 | Inoue et al. |
| 2010/0283555 A1 | 11/2010 | Tanaka et al. |
| 2012/0293276 A1 | 11/2012 | Iwaki et al. |

FOREIGN PATENT DOCUMENTS

| | | |
|---|---|---|
| JP | 2011-160203 A | 8/2011 |
| KR | 10-2010-0046025 A | 5/2010 |
| WO | 2008/146552 A1 | 12/2008 |
| WO | 2009/082012 A1 | 7/2009 |

OTHER PUBLICATIONS

Official Communication issued in International Patent Application No. PCT/JP2013/067535, mailed on Oct. 1, 2013.

*Primary Examiner* — Robert Pascal
*Assistant Examiner* — Kimberly Glenn
(74) *Attorney, Agent, or Firm* — Keating & Bennett, LLP

(57) ABSTRACT

A filter device includes a single terminal and first and second balanced terminals. A balanced filter is connected between the single terminal and the first and second balanced terminals. The filter device includes a compensation circuit including at least one of a first compensation circuit portion connected between the single terminal and the first balanced terminal and a second compensation circuit portion connected between the single terminal and the second balanced terminal. The compensation circuit includes a resonant circuit that increases attenuation in a specified frequency band within a stop band of the balanced filter, compared with a case in which the compensation circuit is not connected.

18 Claims, 10 Drawing Sheets

FILTER DEVICE AND DUPLEXER INCLUDING COMPENSATION CIRCUIT

BACKGROUND OF THE INVENTION

1. Field of the Invention

The present invention relates to filter devices including a balanced filter, and more specifically, relates to a filter device including a compensation circuit through which a signal path to a first balanced terminal and a signal path to a second balanced terminal are connected to each other.

2. Description of the Related Art

To date, in a duplexer of a cellular phone, a reception filter is formed of a balanced filter in many cases.

Japanese Unexamined Patent Application Publication No. 2011-160203 discloses a duplexer illustrated in FIG. 19. In a duplexer 1001, a transmission filter 1004 is connected between an antenna terminal 1002 and a transmission terminal 1003. A reception filter 1005 is connected to the antenna terminal 1002. The reception filter 1005 has a balanced-unbalanced transforming function. In other words, one end of the reception filter 1005 is connected to the antenna terminal 1002. The reception filter 1005 is connected to a first balanced terminal 1006 and a second balanced terminal 1007, which function as reception terminals.

As illustrated, the transmission filter 1004 has a ladder circuit configuration including a plurality of series arm resonators and parallel arm resonators. On the other hand, the reception filter 1005 is formed of a longitudinally coupled resonator-type balanced filter.

In the duplexer 1001, a compensation circuit 1008 is connected between the transmission terminal 1003 and the first and second balanced terminals 1006 and 1007. The compensation circuit 1008 includes a capacitor 1009 and a capacitor 1010. The capacitor 1009 and the capacitor 1010 are connected in series with each other between the first balanced terminal 1006 and the second balanced terminal 1007. A connection node between the first and second capacitors 1009 and 1010 is connected to the transmission terminal 1003.

It is stated in Japanese Unexamined Patent Application Publication No. 2011-160203 that, by using the compensation circuit 1008 described above, isolation at the time when the first balanced terminal 1006 functioning as a reception terminal is viewed from the transmission terminal 1003 and isolation at the time when the second balanced terminal 1007 is viewed from the transmission terminal 1003 are improved. Further, it is also stated that differential isolation obtained by synthesizing the isolations of the two paths using a balun is also improved.

It is stated in Japanese Unexamined Patent Application Publication No. 2011-160203 that differential mode isolation can be improved. However, the improvement effect of differential mode isolation in Japanese Unexamined Patent Application Publication No. 2011-160203 is not sufficient, and it is strongly required that differential mode isolation be further improved. In addition, it is difficult to improve differential mode isolation while suppressing degradation of insertion loss in a specific band.

SUMMARY OF THE INVENTION

Preferred embodiments of the present invention provide a filter apparatus that improves differential mode isolation more effectively while suppressing degradation of insertion loss.

A filter device according to a preferred embodiment of the present invention includes a single terminal, first and second balanced terminals, a balanced filter and a compensation circuit. The balanced filter is connected between the single terminal and the first and second balanced terminals. The compensation circuit includes at least one of a first compensation circuit portion connected between the single terminal and the first balanced terminal and a second compensation circuit portion connected between the single terminal and the second balanced terminal. The compensation circuit preferably includes a resonant circuit configured to increase attenuation in a specified frequency band within a stop band of the balanced filter, compared with a case in which the compensation circuit is not connected.

In a specific aspect of the filter device according to various preferred embodiments of the present invention, the resonant circuit is configured such that a signal propagating through a first signal path from the single terminal to the first balanced terminal and a signal propagating through a second signal path from the single terminal to the second balanced terminal have the same amplitude and phase in a portion of the specified frequency band.

In another specific aspect of the filter device according to various preferred embodiments of the present invention, the compensation circuit includes the resonant circuit and a reactance circuit connected to the resonant circuit. In this case, a signal propagating through a first signal path and a signal propagating through a second signal path is easily be made to have the same or approximately the same amplitude and phase. The reactance circuit may include a capacitor. In this case, the amplitude and phase are easily controlled in accordance with the amount of capacitance, the routing of wiring lines, and the like.

In further another specific aspect of the filter device according to various preferred embodiments of the present invention, the resonant circuit includes an LC resonant circuit. In this case, the frequency characteristics of the amplitude characteristics in the compensation circuit are easily adjusted.

In further another specific aspect of the filter device according to various preferred embodiments of the present invention, the reactance circuit includes first and second capacitors connected in series with each other on a line connecting the single terminal to the first or second balanced terminal, and the resonant circuit is connected between a connection node between the first capacitor and the second capacitor and a ground potential. In this case, the capacitances of the first and second capacitors are decreased.

In another specific aspect of the filter device according to various preferred embodiments of the present invention, the reactance circuit includes a third capacitor connected on a line connecting the single terminal to the first or second balanced terminal. Further, the resonant circuit connected between the ground potential and two connection nodes of the third capacitor, through which the third capacitor is connected to the single terminal and the first or second balanced terminal, includes a fourth capacitor one end of which is connected to one of the two connection nodes of the third capacitor, a fifth capacitor one end of which is connected to the other of the two connection nodes of the third capacitor, and an inductor connected to the other ends of the fourth and fifth capacitors.

In still another specific aspect of the filter device according to various preferred embodiments of the present invention, the filter device includes the first and second compensation circuit portions, and each of the first and second compensation circuit portions includes the reactance circuit and the resonant circuit.

In still another specific aspect of the filter device according to various preferred embodiments of the present invention, the single terminal is a transmission terminal and the first and second balanced terminals are first and second reception terminals, the filter device further includes: an antenna terminal and a transmission filter connected between the antenna terminal and the transmission terminal, and the balanced filter is a balanced reception filter connected between the antenna terminal and the first and second reception terminals functioning as the first and second balanced terminals to provide a duplexer. Hence, the differential mode isolation of the first and second reception terminals from the transmission terminal are effectively improved.

In still another specific aspect of the filter device according to various preferred embodiments of the present invention, a resonant frequency of the resonant circuit is located within a pass band of the transmission filter. In this case, the differential mode isolation is improved while suppressing the degradation of the common mode isolation in the transmission band.

In the filter device according to various preferred embodiments of the present invention, the compensation circuit includes a resonant circuit that increases attenuation in a specific frequency band within the stop band of the balanced filter and, hence, differential mode isolation in the specific frequency band is effectively improved, while suppressing degradation of insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to drawings.

First Preferred Embodiment

Figure 1:
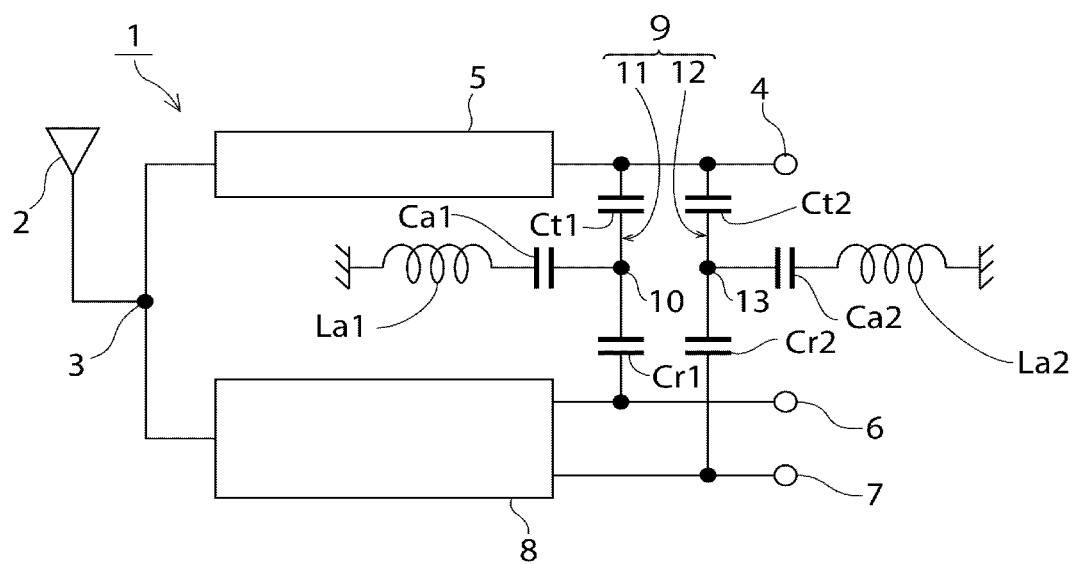
FIG. 1 is a circuit diagram of a filter device according to a first preferred embodiment of the present invention.

FIG. 1 is a circuit diagram of a filter device according to a first preferred embodiment of the present invention.

A filter device 1 includes an antenna terminal 3 connected to an antenna 2. A transmission filter 5 is connected between the antenna terminal 3 and a transmission terminal 4. A reception filter 8 defining and functioning as a balanced filter is connected between the antenna terminal 3 and first and second balanced terminals 6 and 7.

The filter device 1 of the present preferred embodiment defines a duplexer of a cellular phone. The transmission filter 5 and the reception filter 8 preferably include respective elastic wave filters, although not specifically limited.

The reception filter 8 includes a balanced-unbalanced transforming function connected between the antenna terminal 3 and the first and second balanced terminals 6 and 7, as described above. In other words, the reception filter 8 is a balanced filter.

In the present preferred embodiment, a compensation circuit 9 is connected between the transmission terminal 4 defining and functioning as a single terminal and the first and second balanced terminals 6 and 7. In the present preferred embodiment, the compensation circuit 9 includes a first compensation circuit portion 11 and a second compensation circuit portion 12. The first compensation circuit portion 11 includes capacitors Ct1, Cr1, and Ca1 and an inductor La1. The capacitor Ct1 and the capacitor Cr1 are connected in series with each other between the transmission terminal 4 and the first balanced terminal 6. The capacitor Ct1 and the capacitor Cr1 define a reactance circuit. The capacitor Ct1 is arranged on the transmission terminal 4 side and the capacitor Cr1 is arranged on the first balanced terminal 6 side.

The capacitor Ca1 and the inductor La1 are connected in series with each other between a connection node 10 between the capacitor Ct1 and the capacitor Cr1 and a ground potential, such that an LC resonant circuit is provided between the connection node 10 and the ground potential.

Similarly, the second compensation circuit portion 12 includes capacitors Ct2 and Cr2 connected in series with each other between the transmission terminal 4 and the second balanced terminal 7. The capacitor Ct2 and the capacitor Cr2 define a reactance circuit. An LC resonant circuit is provided between the connection node 13 between the capacitors Ct2 and Cr2 and the ground potential. In other words, an LC resonant circuit including a capacitor Ca2 and an inductor La2 is provided.

The filter device 1 of the present preferred embodiment includes the compensation circuit 9 connected between the transmission terminal 4 and the first and second balanced terminals 6 and 7. With this configuration, difference mode isolation in a reception band is significantly improved without causing degradation of insertion loss. This will be described with reference to FIG. 2 and FIG. 3.

It is assumed that the pass band, i.e., transmission band of the transmission filter 5 is about 1920-1980 MHz, and the reception band, i.e., pass band of the reception filter 8 is about 2110-2170 MHz, for example.

The values of the capacitances Ct1, Cr1, and Ca1 and the inductance La1 were set as follows.
Ct1=0.25 pF, Cr1=0.285 pF, Ca1=6 pF, and La1=1.11 nH.
Similarly, the values of the capacitances Ct2, Cr2, and Ca2 and the inductance La2 were set as follows.
Ct2=0.25 pF, Cr2=0.25 pF, Ca2=8.33 pF, and La2=0.8 nH.

As a comparative example, a filter device was prepared which has a configuration similar to that of the first preferred embodiment of the present invention, except that the compensation circuit 9 described above is not connected.

Figure 2:
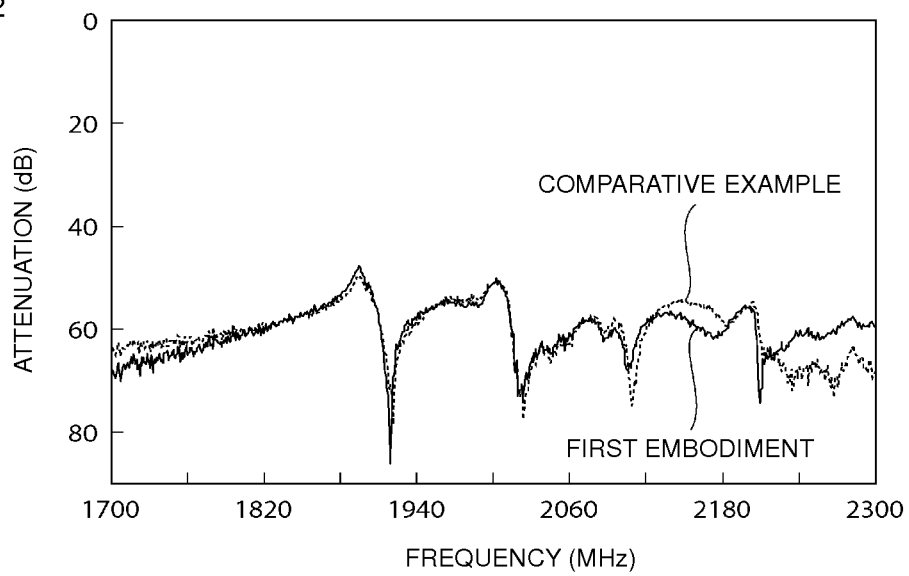
FIG. 2 is a diagram illustrating the differential mode isolation characteristics in the filter device of the first preferred embodiment of the present invention and the differential mode isolation characteristics of a filter device of a comparative example.

The solid line in FIG. 2 represents the differential mode isolation (DMI) characteristics of the first preferred embodiment described above, and the broken line represents the differential mode isolation characteristics of the filter device of the comparative example described above. The solid line in FIG. 3 represents the common mode isolation (CMI) characteristics of the first preferred embodiment described above, and the broken line represents the common mode isolation characteristics of the filter device of the comparative example described above.

Note that the differential mode isolation refers to the following characteristics. That is, assuming that a path through which a signal propagates from the transmission terminal 4 to the first balanced terminal 6 is a first signal path and that a path through which a signal propagates from the transmission terminal 4 to the second balanced terminal 7 is a second signal path, differential mode isolation is defined as a difference between the isolation of the first balanced terminal from, and seen from, the transmission terminal 4 and the isolation of the second balanced terminal 7 from, and seen from, the transmission terminal 4. In other words, assuming that the first balanced terminal 6 and the second balanced terminal 7 are converted into a single virtual terminal through balanced conversion, the differential mode isolation characteristics are signal isolation characteristics between the reception terminal side and the transmission terminal seen from the transmission terminal.

Figure 3:
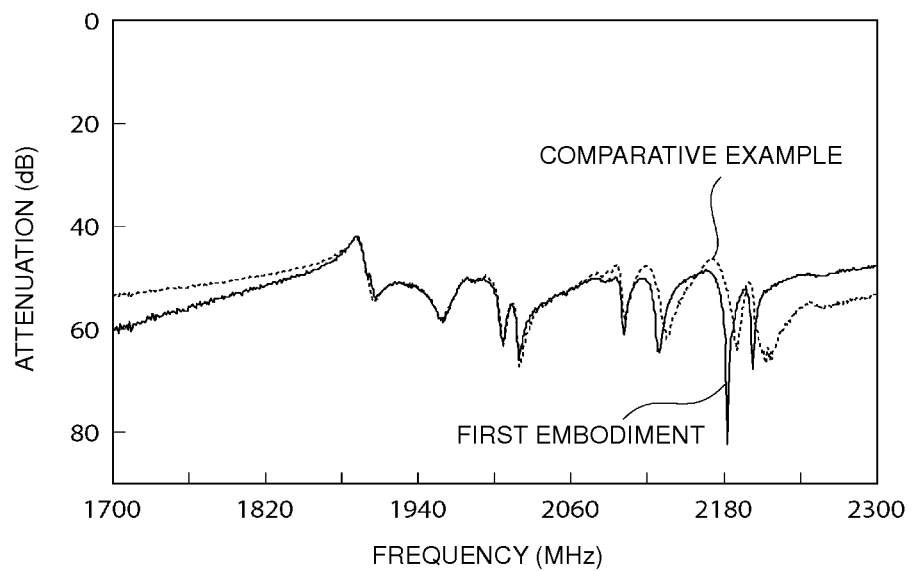
FIG. 3 is a diagram illustrating the common mode isolation characteristics in the filter device of the first preferred embodiment of the present invention and the common mode isolation characteristics of the filter device of the comparative example.

As is clear from FIG. 2 and FIG. 3, compared to the comparative example, degradation of differential mode isolation in the reception band is effectively suppressed in the present preferred embodiment. The Rx band DMI, which is the differential mode isolation in the reception band, the Tx band DMI, which is the differential mode isolation in the transmission band, and the common mode isolation in the transmission band, i.e., the Tx band CMI are shown in Table 1. Note that, for example, the Rx band DMI refers to the worst value of the differential mode isolation in the Rx band. Here, the case in which the values of the DMI and CMI are close to zero corresponds to unfavorable characteristics, and the more negative the values, the more favorable the characteristics.

TABLE 1

| | (IN UNITS OF dB) | | | |
|---|---|---|---|---|
| | Rx BAND DMI | Tx BAND DMI | Tx BAND CMI | Tx INSERTION LOSS |
| COMPARATIVE EXAMPLE | −54.3 | −52.9 | −49.1 | 1.41 |
| FIRST PREFERRED EMBODIMENT | −56.4 | −53.9 | −49.8 | 1.47 |
| AMOUNT OF CHANGE | −2.1 | −1.0 | −0.7 | 0.06 |

As is clear from FIG. 2 and FIG. 3, it can be seen that both the differential mode isolation and common mode isolation are significantly improved, according to the present preferred embodiment, compared with the comparative example.

As is clear from Table 1, the differential mode isolation in the reception band is effectively improved without degrading the insertion loss in the transmission band.

In the present preferred embodiment, as described above, the differential mode isolation, in particular, the differential mode isolation in the reception band is effectively improved. The reason for this is that in the reception band, a signal propagating through the first signal path and a signal propagating through the second signal path have the same or approximately the same amplitude and phase.

In the present preferred embodiment, the resonant circuit in the compensation circuit 9 described above is configured such that a signal propagating through the first signal path and a signal propagating through the second signal path have the same amplitude and phase. In other words, the LC series resonant circuit including the capacitor Ca1 and the inductor La1 and the LC series resonant circuit including the capacitor Ca2 and the inductor La2 are configured such that the above-described relationship regarding the amplitude and phase is satisfied. Hence, in the reception band, compared with the comparative example in which the compensation circuit 9 is not provided, the attenuation is increased such that the differential mode isolation is significantly improved.

In the present preferred embodiment, the compensation circuit 9 described above, includes a reactance circuit including the capacitors Ct1 and Cr1 and a reactance circuit including the capacitors Ct2 and Cr2. In other words, reactance circuits are connected to the resonant circuit. Hence, through adjustment of the capacitances of the capacitors Ct1 and Cr1 in the reactance circuits or the capacitors Ct2 and Cr2, the amplitude in the above-described reception band is easily adjusted. More specifically, by adding a capacitance or increasing a capacitance, the capacitance is easily adjusted to decrease the amplitude. This allows the differential mode isolation to be improved even more effectively.

Note that in the present preferred embodiment, the above-described resonant circuit preferably includes an LC series resonant circuit. However, the first and second compensation circuits may include other various resonant circuits. In addition, the above-described reactance circuits including a capacitor need not necessarily be provided. In other words, only the resonant circuits described above may be respectively provided in the first compensation circuit portion 11 and the second compensation circuit portion 12. Also in this case, the isolation characteristics in the reception band are effectively improved as a result of the resonant circuits being configured as described above. Further, also degradation of the insertion loss in the transmission band is not likely to be generated.

Second Preferred Embodiment

Figure 4:
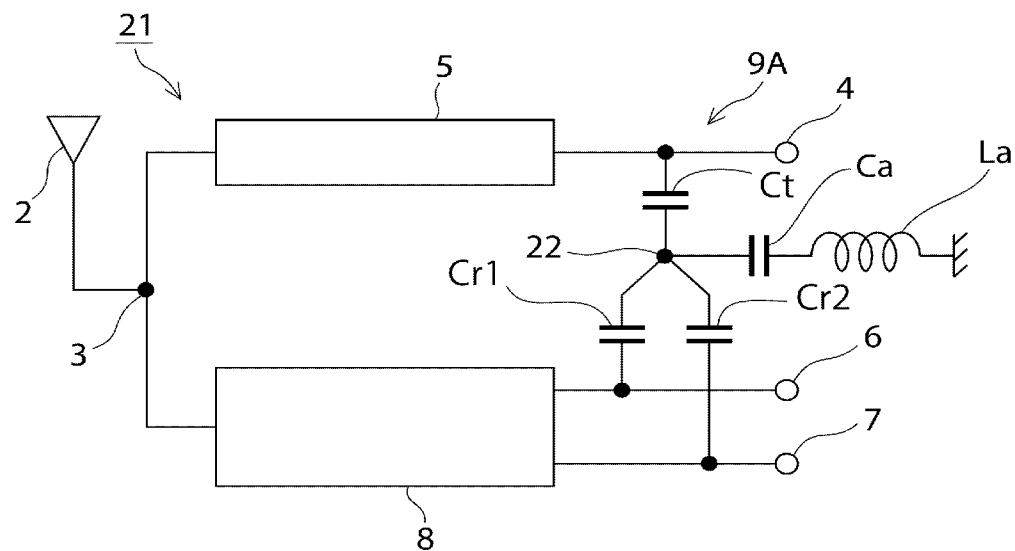
FIG. 4 is a circuit diagram of a filter device according to a second preferred embodiment of the present invention.

FIG. 4 is a circuit diagram of a filter device according to a second preferred embodiment of the present invention. A filter device 21 of the second preferred embodiment is preferably the same as the filter device 1 of the first preferred embodiment except for the configuration of a compensation circuit 9A. Hence, components that are the same as those of the first preferred embodiment are denoted by the same reference symbol, and descriptions thereof that are the same as those of the first preferred embodiment will be omitted.

The compensation circuit 9A is connected between the transmission terminal 4 and the first and second balanced terminals 6 and 7. More specifically, one end of a capacitor Ct is connected to the transmission terminal 4. The capacitor Cr1 is connected between a connection node 22 at the other end of the capacitor Ct and the first balanced terminal 6. The capacitor Cr2 is connected between the connection node 22 and the second balanced terminal 7. A series LC resonant circuit including a capacitor Ca and an inductor La is provided between the connection node 22 and a ground potential. This LC resonant circuit is configured such that a signal propagating through the first signal path and a signal propagating through the second signal path have the same phase and amplitude in at least a portion of the reception band.

As described above, in the compensation circuit 9A, the capacitor Ct is shared, and the capacitor Ct and the LC resonant circuit are shared between the first compensation circuit and the second compensation circuit. In other words, the first compensation circuit includes the capacitor Ct, the capacitor Cr1, and the LC resonant circuit described above, and the second compensation circuit includes the capacitor Ct, the capacitor Cr2, and the LC resonant circuit described above.

Figure 5:
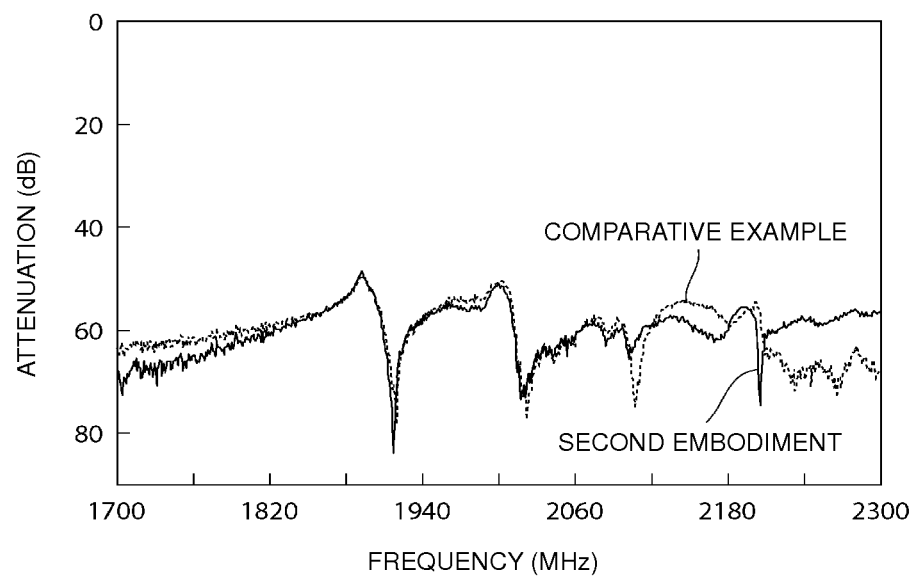
FIG. 5 is a diagram illustrating the differential mode isolation characteristics in the filter device of the second preferred embodiment of the present invention and the differential mode isolation characteristics of a filter device of a comparative example.
Figure 6:
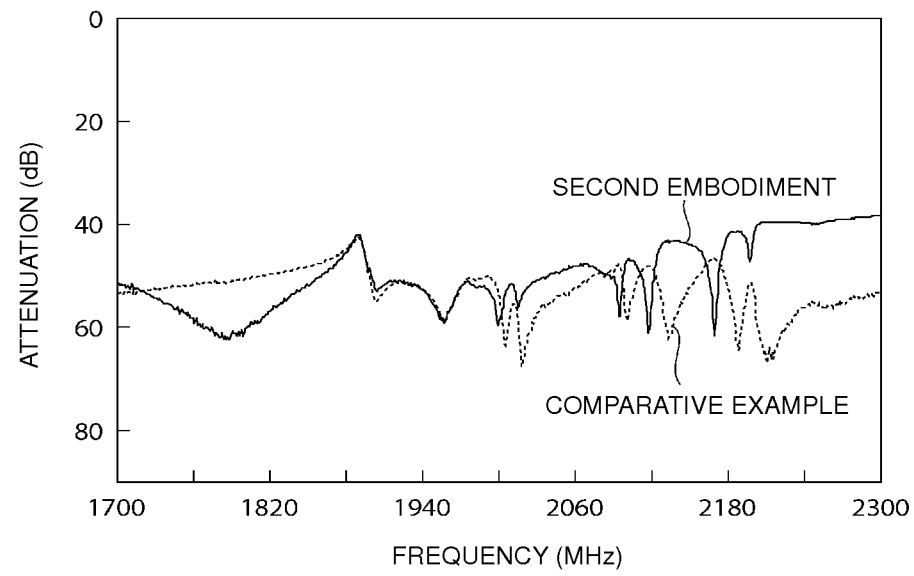
FIG. 6 is a diagram illustrating the common mode isolation characteristics in the filter device of the second preferred embodiment of the present invention and the common mode isolation characteristics of the filter device of the comparative example.

FIG. 5 and FIG. 6 are diagrams respectively illustrating the differential mode isolation characteristics and the common mode isolation characteristics, for the present preferred embodiment and the comparative example. The solid line represents the result of the second preferred embodiment, and the broken line represents the result of the comparative example.

Note that the values of the capacitances and the inductances were set as follows.
Ct=0.50 pF, Cr1=0.57 pF, Cr2=0.50 pF, La=1.11 nH, and Ca=6.0 pF.

As is clear from FIG. 5 and FIG. 6, also in the present preferred embodiment, the differential mode isolation in the reception band is effectively improved. Table 2 below summarizes the results of FIG. 5 and FIG. 6.

TABLE 2

| | (IN UNITS OF dB) | | | |
|---|---|---|---|---|
| | Rx BAND DMI | Tx BAND DMI | Tx BAND CMI | Tx INSERTION LOSS |
| COMPARATIVE EXAMPLE | −54.3 | −52.9 | −49.1 | 1.41 |
| SECOND PREFERRED EMBODIMENT | −57.0 | −54.6 | −50.5 | 1.47 |
| AMOUNT OF CHANGE | −2.7 | −1.6 | −1.4 | 0.06 |

As is clear from table 2, the differential mode isolation in the reception band is significantly improved without causing considerable degradation of the insertion loss in the transmission band, also in the present preferred embodiment. Further, it can be seen that also the differential mode isolation in the transmission band is improved.

Portions of the first compensation circuit and the second compensation circuit may be shared, as in the present preferred embodiment.

Third Preferred Embodiment

Figure 7:
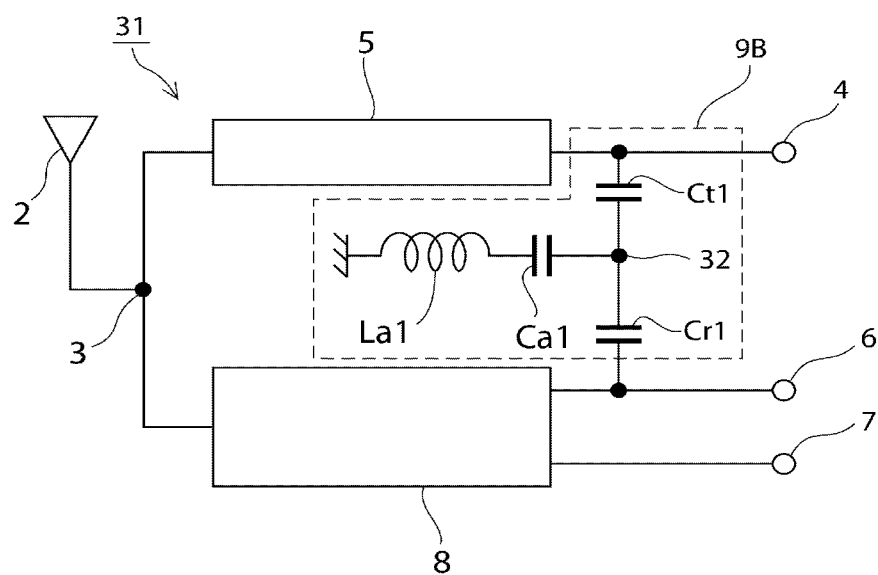
FIG. 7 is a circuit diagram of a filter device according to a third preferred embodiment of the present invention.

FIG. 7 is a circuit diagram of a filter device according to a third preferred embodiment of the present invention. A filter device 31 of the third preferred embodiment is preferably the same as that of the second preferred embodiment except that a compensation circuit 9B is provided instead of the compensation circuit 9A. The compensation circuit 9B is connected between the transmission terminal 4 and the first balanced terminal 6. More specifically, the compensation circuit 9B includes the capacitors Ct1, Cr1, and Ca1 and the inductor La1. The capacitor Ct1 and the capacitor Cr1 are connected in series with each other between the transmission terminal 4 and the first balanced terminal 6. The capacitor Ct1 and the capacitor Cr1 define a reactance circuit. The capacitor Ca1 and the inductor La1 are connected in series with each other between a connection node 32 between the capacitor Ct1 and the capacitor Cr1 and a ground potential such that an LC resonant circuit is provided. Hence, the compensation circuit 9B is configured similarly to the first compensation circuit portion 11 in the first preferred embodiment. On the other hand, a compensation circuit is not connected between the transmission terminal 4 and the second balanced terminal 7 in the present preferred embodiment.

As described above, the compensation circuit in a preferred embodiment of the present invention may include only a compensation circuit connected between the transmission terminal 4 and one of the balanced terminals. Also the present preferred embodiment is configured such that the resonant frequency of the LC resonant circuit is positioned within the pass band of a transmission filter, and a signal propagating through the first signal path and a signal propagating through the second signal path have the same phase and amplitude in a portion of the frequencies within the reception band.

Figure 8:
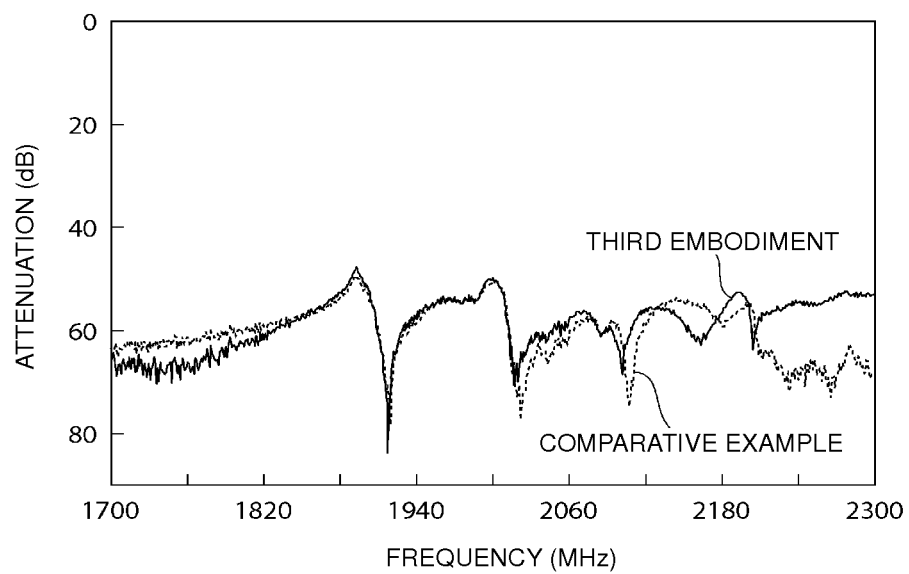
FIG. 8 is a diagram illustrating the differential mode isolation characteristics in the filter device of the third preferred embodiment of the present invention and the differential mode isolation characteristics of a filter device of a comparative example.
Figure 9:
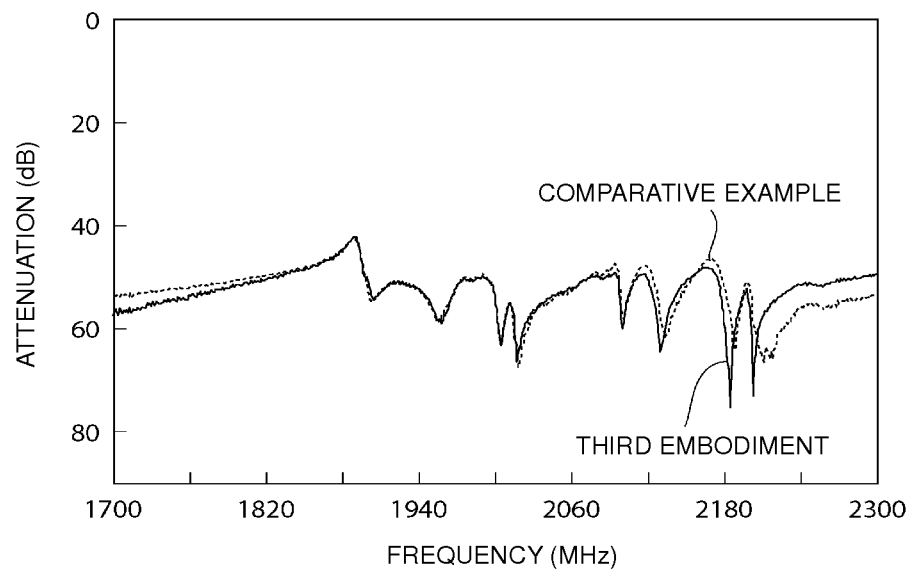
FIG. 9 is a diagram illustrating the common mode isolation characteristics in the filter device of the third preferred embodiment of the present invention and the common mode isolation characteristics of the filter device of the comparative example.

FIG. 8 and FIG. 9 respectively illustrate the differential mode isolation characteristics and the common mode isolation characteristics, for the filter device of the present preferred embodiment and the filter device of a comparative example. The solid line represents the result for the third preferred embodiment and the broken line represents the result for the comparative example.

Note that the comparative example has the same configuration as the third preferred embodiment except that the compensation circuit 9B is not provided in the comparative example.

As is clear from FIG. 8 and FIG. 9, the differential mode isolation in the reception band is effectively improved also in the present preferred embodiment. Table 3 below shows the values of the Rx band DMI, Tx band DMI, and Tx band CMI.

TABLE 3

| | (IN UNITS OF dB) | | | |
|---|---|---|---|---|
| | Rx BAND DMI | Tx BAND DMI | Tx BAND CMI | Tx INSERTION LOSS |
| COMPARATIVE EXAMPLE | −54.3 | −52.9 | −49.1 | 1.41 |
| THIRD PREFERRED EMBODIMENT | −55.6 | −53.5 | −49.5 | 1.42 |
| AMOUNT OF CHANGE | −1.3 | −0.6 | −0.4 | 0.01 |

As is clear from Table 3, it can be seen that the differential mode isolation is significantly improved in the Rx band, i.e., the reception band without causing considerable degradation of the insertion loss in the Tx band, according to the present preferred embodiment, compared with the comparative example.

Fourth Preferred Embodiment

Figure 10:
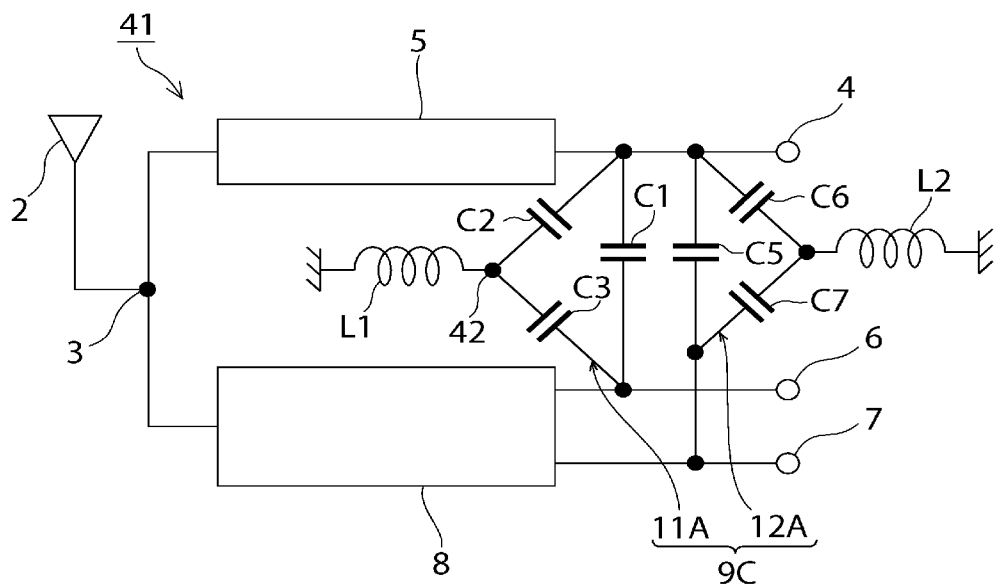
FIG. 10 is a circuit diagram of a filter device according to a fourth preferred embodiment of the present invention.

FIG. 10 is a circuit diagram of a filter device 41 according to a fourth preferred embodiment of the present invention.

The filter device 41 is preferably the same as the filter device 1 of the second preferred embodiment except that a compensation circuit 9C is connected instead of the compensation circuit 9A. The compensation circuit 9C is connected between the transmission terminal 4 and the first and second balanced terminals 6 and 7. More specifically, a capacitor C1 is connected between the transmission terminal 4 and the first balanced terminal 6. Capacitors C2 and C3 are connected in parallel with the capacitor C1. The capacitors C2 and C3 are connected in series with each other. An inductor L1 is connected between a connection node 42 between the capacitors C2 and C3 and a ground potential. In the present preferred embodiment, the capacitors C2 and C3 and the inductor L1 define an LC resonant circuit, and the capacitor C1 defines a reactance circuit. The capacitor C1, the capacitors C2 and C3, and the inductor L1 define a first compensation circuit portion 11A.

Similarly, a second compensation circuit portion 12A is provided between the transmission terminal 4 and the second balanced terminal 7. The second compensation circuit portion 12A preferably has a similar configuration to the first compensation circuit portion 11A. In other words, the second compensation circuit portion 12A includes a reactance circuit including a capacitor C5, and an LC resonant circuit including capacitors C6 and C7 and an inductor L2.

C1=0.001 pF, C2=0.231 pF, C3=0.231 pF, and L1=1.11 nH.

Similarly, the capacitances C5, C6, and C7 and the inductance L2 were set as follows.

C5=0.001 pF, C6=0.231 pF, C7=0.231 PF, and L2=1.11 nH.

Figure 11:
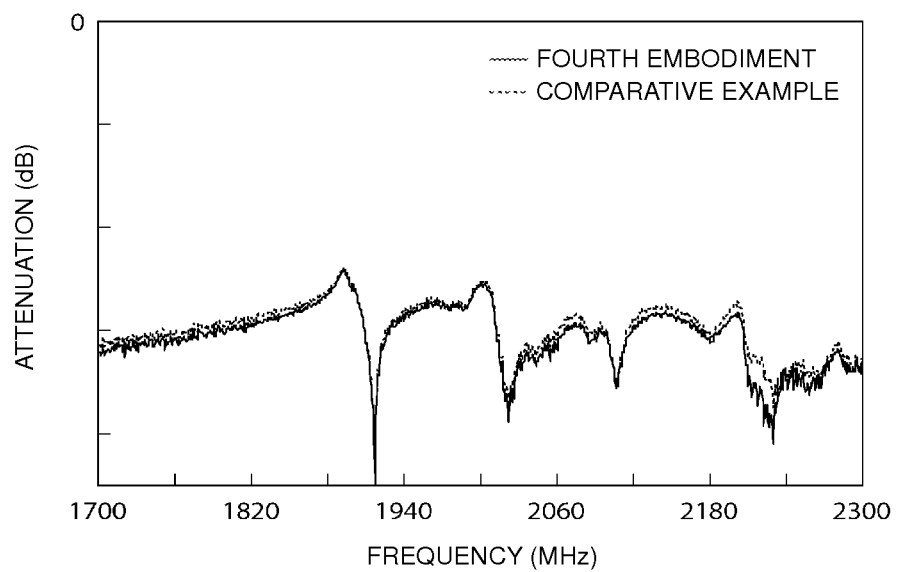
FIG. 11 is a diagram illustrating the differential mode isolation characteristics in the filter device of the fourth preferred embodiment and the differential mode isolation characteristics of a filter device of a comparative example.
Figure 12:
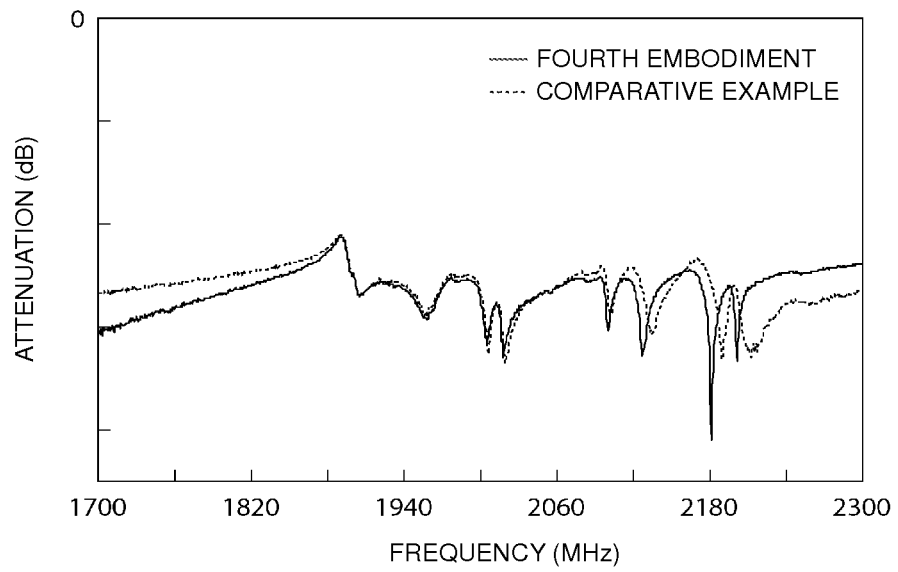
FIG. 12 is a diagram illustrating the common mode isolation characteristics in the filter device of the fourth preferred embodiment of the present invention and the common mode isolation characteristics of the filter device of the comparative example.

FIG. 11 and FIG. 12 respectively illustrate differential mode isolation characteristics and common mode isolation characteristics, for the filter device of the present preferred embodiment and the filter device of a comparative example. The solid line represents the result of the fourth preferred embodiment, and the broken line represents the result of the comparative example.

Note that the comparative example preferably has the same configuration as the fourth preferred embodiment except that the compensation circuit 9C is not provided in the comparative example.

Also in the present preferred embodiment, the resonant circuit is configured such that a signal propagating through the first signal path and a signal propagating through the second signal path have the same phase and amplitude in at least a portion of the frequencies within the reception band, and configured in such a manner that the resonant frequency of the resonant circuit is positioned within the transmission band. In the fourth preferred embodiment illustrated in FIG. 10, the compensation circuit portion 11A and the compensation circuit portion 12A each include an inductor. Hence, the characteristics of the compensation circuit portion 11A and the characteristics of the compensation circuit portion 12A are capable of being independently designed. Therefore, the degree of freedom of the design is greatly enhanced.

Here, the differential mode isolation was improved by the two capacitors Ct1 and Ct2 having a capacitance of about 0.25 pF, in the configuration with the Y-type circuit illustrated in FIG. 1, for example. On the other hand, with the Δ-type circuit configuration illustrated in FIG. 10, a similar effect to the first preferred embodiment is realized by the two capacitors C1 and C5 having a capacitance of about 0.001 pF or less, for example. Hence, the compensation circuits is easily reduced in size.

Table 4 below shows the values of the Rx band DMI, Tx band DMI, and Tx band CMI.

TABLE 4

| | (IN UNITS OF dB) | | | |
|---|---|---|---|---|
| | Rx BAND DMI | Tx BAND DMI | Tx BAND CMI | Tx INSERTION LOSS |
| COMPARATIVE EXAMPLE | −54.3 | −52.9 | −49.1 | 1.41 |
| FOURTH PREFERRED EMBODIMENT | −55.7 | −53.8 | −49.7 | 1.47 |
| AMOUNT OF CHANGE | −1.4 | −0.9 | −0.7 | 0.06 |

As is clear from Table 4, it can be seen that the differential mode isolation is significantly improved in the Rx band, i.e., the reception band without causing considerable degradation of the insertion loss in the Tx band, according to the fourth preferred embodiment, compared with the comparative example.

Modification of Fourth Preferred Embodiment

Figure 13:
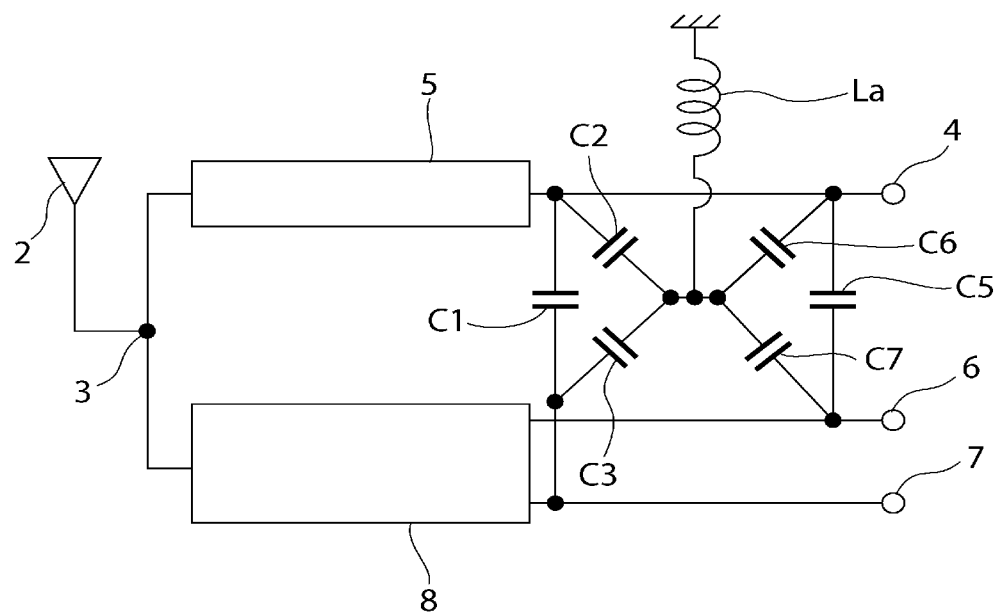
FIG. 13 is a circuit diagram of a filter device according to a modification of the fourth preferred embodiment of the present invention.

A circuit diagram illustrated in FIG. 13 is a modification of the fourth preferred embodiment of the present invention.

The modification of the fourth preferred embodiment is preferably the same as the fourth preferred embodiment except for a configuration in which the inductor L1 and the inductor L2 in FIG. 10 have been replaced by a common inductor La. Note that the inductance of the inductor La preferably is about 0.555 nH, for example.

In the present modification, the inductor of the compensation circuit is shared and, hence, the number of inductors is decreased from two to one. Specifically, in the fourth preferred embodiment, improvement in the differential mode isolation is realized by a compensation circuit including the two inductors L1 and L2 having an inductance of about 1.11 nH, for example. On the other hand, in the present modification, similar improvement is realized by a compensation circuit including the single inductor La having an inductance of about 0.555 nH, for example.

Figure 14:
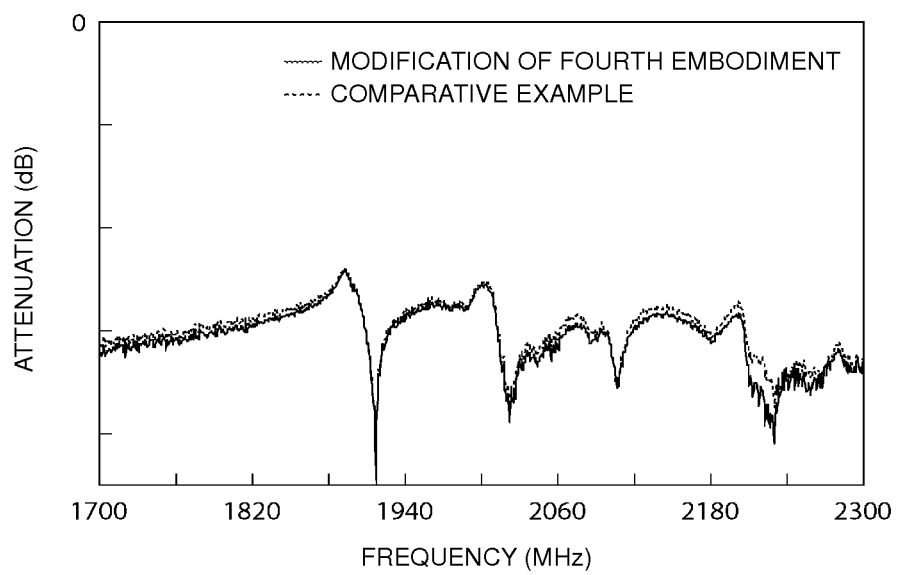
FIG. 14 is a diagram illustrating the differential mode isolation characteristics of the filter device according to the modification of the fourth preferred embodiment of the present invention and a filter device of a comparative example.
Figure 15:
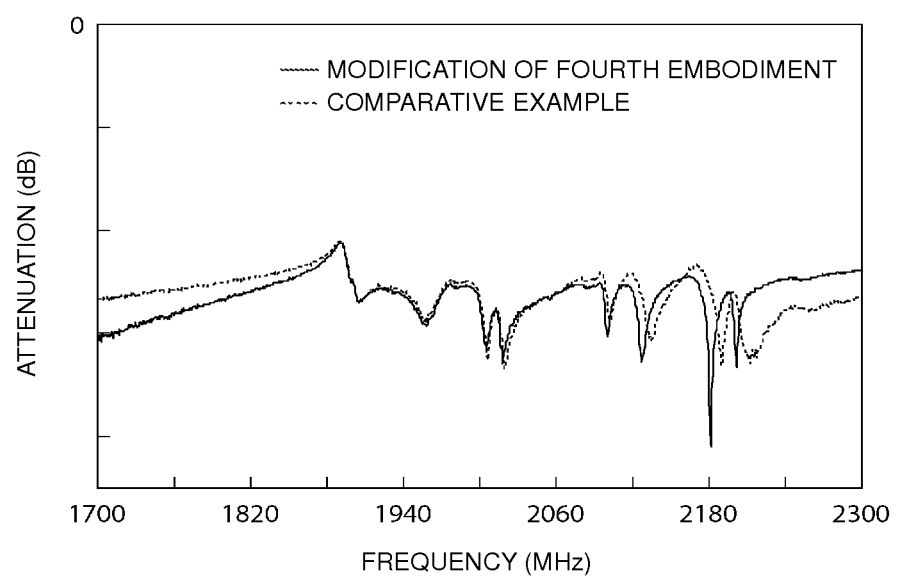
FIG. 15 is a diagram illustrating the common mode isolation characteristics of the filter device according to the modification of the fourth preferred embodiment of the present invention and the filter device of the comparative example.

Note that the differential mode isolation characteristics and common mode isolation characteristics of the filter device of the present modification are respectively illustrated in FIG. 14 and FIG. 15, using solid lines. Note that the broken lines in FIG. 14 and FIG. 15 represent the characteristics of the comparative example illustrated in FIG. 11 and FIG. 12. As is clear from FIG. 14 and FIG. 15, the results of the present modification are about the same as those of the fourth preferred embodiment illustrated in FIG. 11 and FIG. 12 using solid lines.

With the compensation circuit of the present modification, the number of inductors included in the compensation circuit is smaller than that of the fourth preferred embodiment and the inductance is smaller than that of the fourth preferred embodiment. Hence, reduction in size is further facilitated.

Table 5 below shows the values of the Rx band DMI, Tx band DMI, and Tx band CMI.

TABLE 5

| | (IN UNITS OF dB) | | | |
|---|---|---|---|---|
| | Rx BAND DMI | Tx BAND DMI | Tx BAND CMI | Tx INSERTION LOSS |
| COMPARATIVE EXAMPLE | −54.3 | −52.9 | −49.1 | 1.41 |
| MODIFICATION OF FOURTH PREFERRED EMBODIMENT | −55.7 | −53.8 | −49.7 | 1.47 |
| AMOUNT OF CHANGE | −1.4 | −0.9 | −0.7 | 0.06 |

As is clear from Table 5, it can be seen that the differential mode isolation is significantly improved in the Rx band, i.e., the reception band without causing considerable degradation of the insertion loss in the Tx band, according to the present modification, compared with the comparative example.

Hence, also in the modification, similarly to the first to third preferred embodiments, the differential mode isolation in the reception band is significantly improved without causing considerable degradation of the insertion loss in the transmission band. Isolation of a reception terminal side from a transmission terminal side is significantly improved in each of the first to fourth preferred embodiments. In recent years, in accordance with an increase in the output power of a mobile communication apparatus, it is strongly required that the above-described differential mode isolation, in particular, that the differential mode isolation in a reception band be improved. Such a requirement is easily satisfied, according to the first to fourth preferred embodiments.

Fifth Preferred Embodiment

Figure 16:
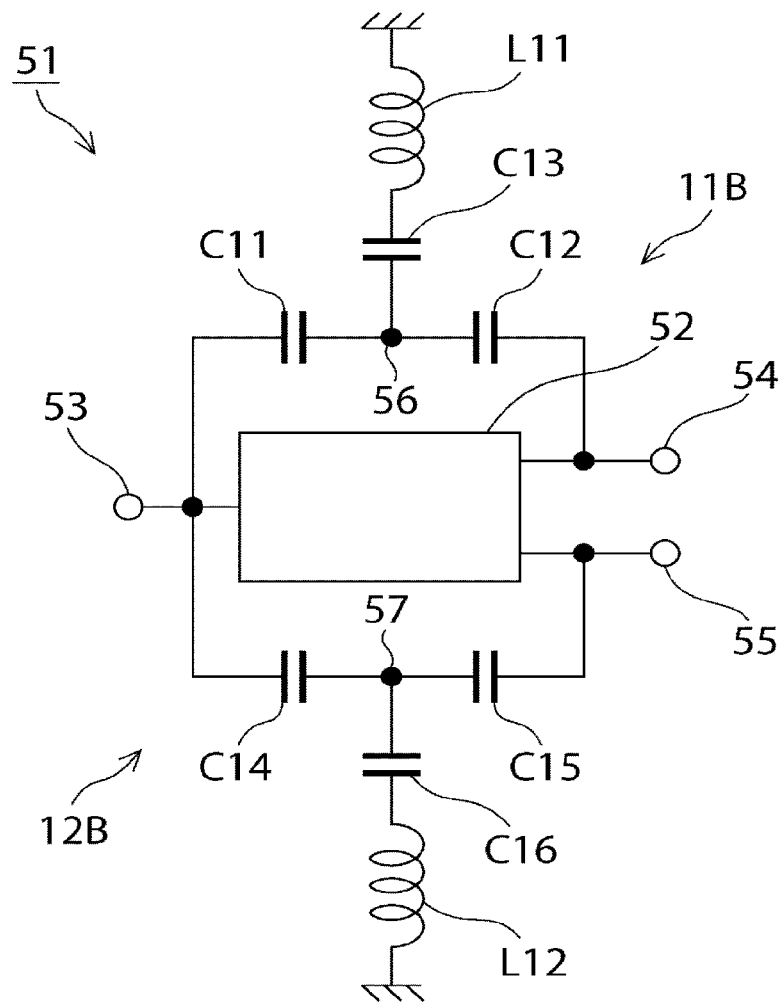
FIG. 16 is a circuit diagram of a filter device according to a fifth preferred embodiment of the present invention.

FIG. 16 is a circuit diagram of a filter device according to a fifth preferred embodiment of the present invention. A filter device 51 includes a balanced filter 52. The balanced filter 52 includes an input terminal 53 defining and functioning as a single terminal and first and second balanced terminals 54 and 55 defining and functioning as output terminals. Here, a first compensation circuit portion 11B is connected between the input terminal 53 and the first balanced terminal 54. The first compensation circuit portion 11B includes capacitors C11 and C12 connected in series with each other. The capacitor C11 is connected to the input terminal 53 side. A capacitor C13 and an inductor L11 are connected between a ground potential and a connection node 56 between the capacitor C11 and the capacitor C12. The capacitor C13 and the inductor L11 are connected in series with each other, thus defining an LC resonant circuit.

Similarly, a second compensation circuit portion 12B is connected between the input terminal 53 and the second balanced terminal 55. The second compensation circuit portion 12B preferably has the same or approximately the same configuration as the first compensation circuit portion 11B. In other words, a capacitor C14 and a capacitor C15 are connected in series with each other, thus defining a reactance circuit. A capacitor C16 and an inductor L12 are connected between the ground potential and a connection node 57 between the capacitor C14 and the capacitor C15. The capacitor C16 and the inductor L12 define an LC resonant circuit.

Also in the present preferred embodiment, the LC resonant circuit is configured such that a signal propagating through a first signal path and a signal propagating through a second signal path are subjected to large attenuation in a specific frequency band within a stop band outside of a pass band, compared with the case in which the circuit is not connected. More specifically, the LC resonant circuit is configured such that a signal propagating through the first signal path that extends from the input terminal 53 to the first balanced terminal 54 and a signal propagating through the second signal path that extends from the input terminal 53 to the second balanced terminal 55 through the balanced filter have the same phase and the same amplitude in at least a portion of frequencies within the above-described specified frequency band.

Hence, similarly to the first to fourth preferred embodiments of the present invention, differential mode isolation is significantly improved.

As is clear from the fifth preferred embodiment, the filter device in the present invention is not limited to a duplexer, and may be a device that includes only a balanced filter.

Figure 17:
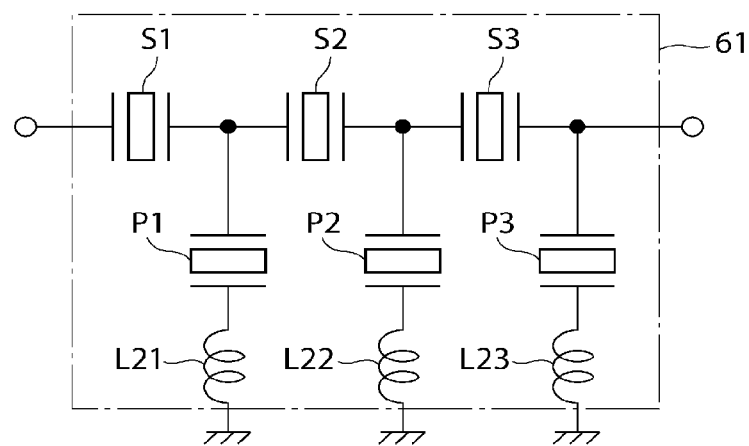
FIG. 17 is a circuit diagram illustrating an example a transmission filter.

The transmission filter 5 and the reception filter 8, which have been represented as functional blocks in the first to fourth preferred embodiments, may be realized by various circuits that utilize resonators such as elastic wave resonators. FIG. 17 is a circuit diagram illustrating an example circuit defining such a transmission filter. The transmission filter illustrated in FIG. 17 includes a ladder circuit, provided therein, which includes a plurality of series arm resonators S1-S3, parallel arm resonators P1-P3, and inductors L21-L23. The transmission filter may preferably include a filter including a ladder circuit like this. Actually, the plurality of series arm resonators S1-S3 and parallel arm resonators P1-P3 described above may preferably include electrode structures provided on a piezoelectric substrate 61 illustrated by a one-dot chain line.

Figure 18:
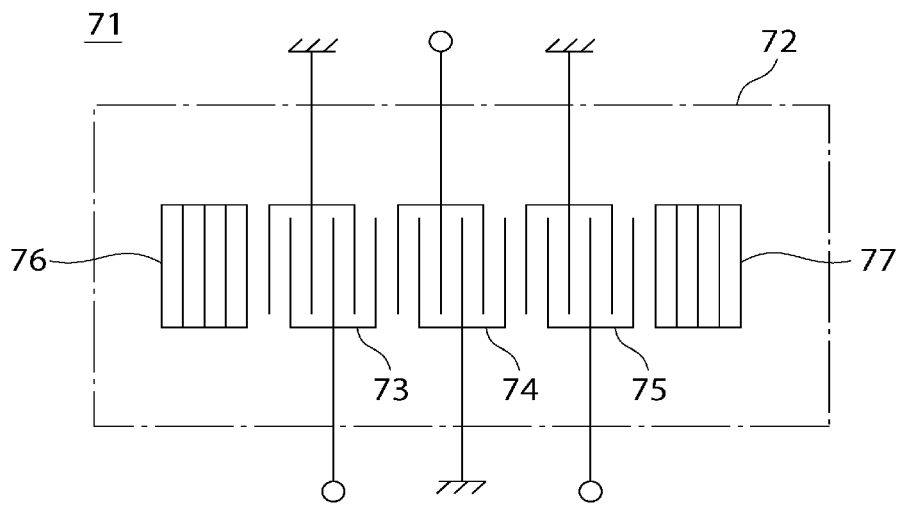
FIG. 18 is a schematic plan view of an example reception filter functioning as a balanced filter included in a preferred embodiment of the present invention.
Figure 19:
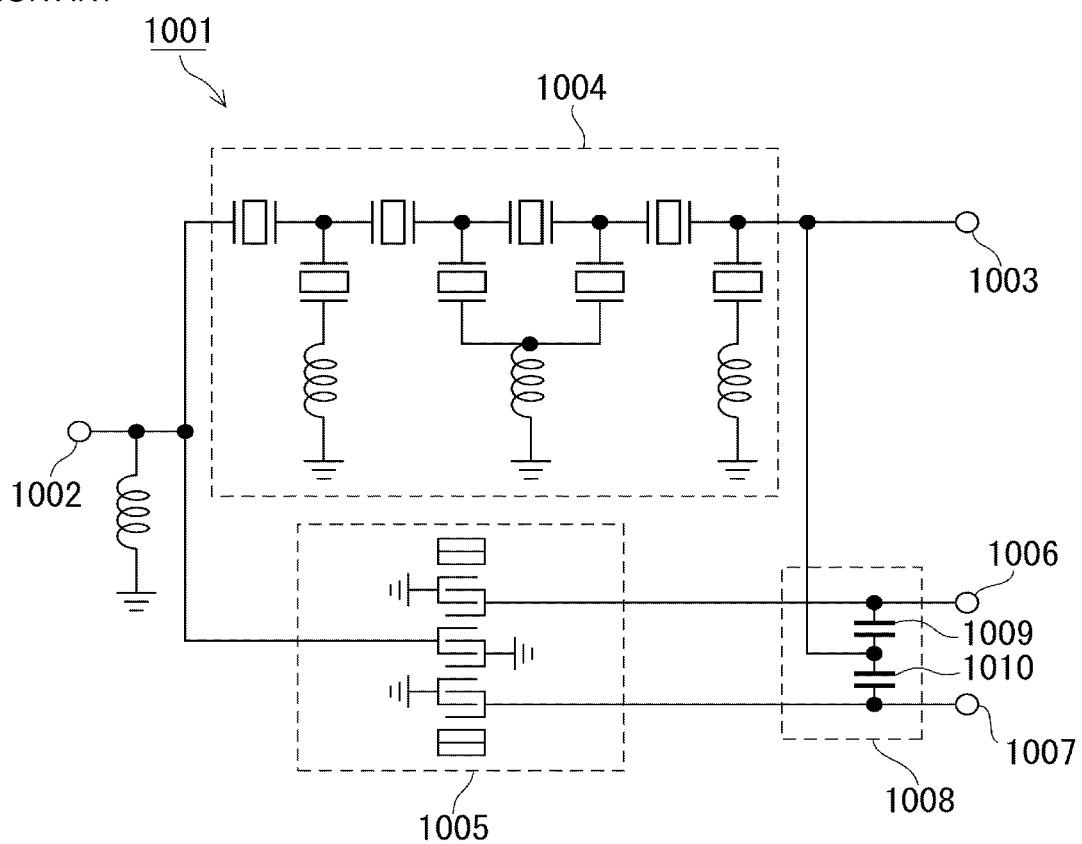
FIG. 19 is a circuit diagram of an existing duplexer.

FIG. 18 is a schematic plan view of an example balanced filter defining a reception filter. A balanced filter 71 illustrated in FIG. 18 includes first to third IDTs 73 to 75 arranged on a piezoelectric substrate 72 in the propagation direction of a surface acoustic wave. Reflectors 76 and 77 are arranged on the two sides, in the elastic wave propagation direction, of a region in which the IDTs 73 to 75 are arranged. Hence, a 3-IDT longitudinally coupled resonator-type balanced filter having a balanced-unbalanced conversion function is provided.

Note that FIG. 17 and FIG. 18 illustrate only an example of the elastic wave filters that form the transmission filter 5 and the reception filter 8 described above. In other words, the transmission filter 5 may include one of elastic wave filters having various other circuit configurations or a filter device other than an elastic wave filter. Similarly, the reception filter 8 may include one of elastic wave filters having various other circuit configurations or a filter device other than an elastic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
  a single terminal;
  first and second balanced terminals;
  a balanced filter connected between the single terminal and the first and second balanced terminals;
  a compensation circuit including at least one of a first compensation circuit portion connected between the single terminal and the first balanced terminal and a second compensation circuit portion connected between the single terminal and the second balanced terminal; wherein
  the compensation circuit includes a resonant circuit configured to increase attenuation in a frequency band within a stop band of the balanced filter; and
  the resonant circuit is configured such that a signal propagating through a first signal path from the single terminal to the first balanced terminal and a signal propagating through a second signal path from the single terminal to the second balanced terminal have a same amplitude and phase in a portion of the frequency band.

2. The filter device according to claim 1, wherein the resonant circuit includes an LC resonant circuit.

3. The filter device according to claim 1, wherein
  the single terminal is a transmission terminal and the first and second balanced terminals are first and second reception terminals;
  the filter device further includes:
  an antenna terminal; and
    a transmission filter connected between the antenna terminal and the transmission terminal; wherein
  the balanced filter is a balanced reception filter connected between the antenna terminal and the first and second reception terminals defining the first and second balanced terminals.

4. The filter device according to claim 3, wherein a resonant frequency of the resonant circuit is within a pass band of the transmission filter.

5. A filter device comprising:
  a single terminal;
  first and second balanced terminals;
  a balanced filter connected between the single terminal and the first and second balanced terminals;
  a compensation circuit including at least one of a first compensation circuit portion connected between the single terminal and the first balanced terminal and a second compensation circuit portion connected between the single terminal and the second balanced terminal; wherein
  the compensation circuit includes a resonant circuit configured to increase attenuation in a frequency band within a stop band of the balanced filter, and a reactance circuit connected to the resonant circuit.

6. The filter device according to claim 5, wherein the reactance circuit includes a capacitor.

7. The filter device according to claim 5, wherein the reactance circuit includes first and second capacitors connected in series with each other on a line connecting the single terminal to the first or second balanced terminal, and the resonant circuit is connected between a connection node between the first capacitor and the second capacitor and a ground potential.

8. The filter device according to claim 7, wherein each of the first and second compensation circuit portions includes the reactance circuit and the resonant circuit.

9. The filter device according to claim 5, wherein
  the reactance circuit includes a third capacitor connected on a line connecting the single terminal to the first or second balanced terminal; and
  the resonant circuit connected between the ground potential and two connection nodes of the third capacitor, through which the third capacitor is connected to the single terminal and the first or second balanced terminal, includes a fourth capacitor one end of which is connected to one of the two connection nodes of the third capacitor, a fifth capacitor one end of which is connected to the other of the two connection nodes of the third capacitor, and an inductor connected to the other ends of the fourth and fifth capacitors.

10. A duplexer comprising:
  an antenna terminal;
  a transmission filter;
  a single terminal defining a transmission terminal;
  first and second balanced terminals defining first and second reception terminals;
  a balanced reception filter connected between the single terminal and the first and second balanced terminals;
  a compensation circuit including at least one of a first compensation circuit portion connected between the single terminal and the first balanced terminal and a second compensation circuit portion connected between the single terminal and the second balanced terminal; wherein
  the compensation circuit includes a resonant circuit configured to increase attenuation in a frequency band within a stop band of the balanced filter.

11. The duplexer according to claim 10, wherein the resonant circuit is configured such that a signal propagating through a first signal path from the single terminal to the first balanced terminal and a signal propagating through a second signal path from the single terminal to the second balanced terminal have a same amplitude and phase in a portion of the frequency band.

12. The duplexer according to claim 10, wherein the compensation circuit includes the resonant circuit and a reactance circuit connected to the resonant circuit.

13. The duplexer according to claim 12, wherein the reactance circuit includes a capacitor.

14. The duplexer according to claim 12, wherein the reactance circuit includes first and second capacitors connected in series with each other on a line connecting the single terminal to the first or second balanced terminal, and the resonant circuit is connected between a connection node between the first capacitor and the second capacitor and a ground potential.

15. The duplexer according to claim 14, wherein each of the first and second compensation circuit portions includes the reactance circuit and the resonant circuit.

16. The duplexer according to claim 12, wherein
the reactance circuit includes a third capacitor connected on a line connecting the single terminal to the first or second balanced terminal; and
the resonant circuit connected between the ground potential and two connection nodes of the third capacitor, through which the third capacitor is connected to the single terminal and the first or second balanced terminal, includes a fourth capacitor one end of which is connected to one of the two connection nodes of the third capacitor, a fifth capacitor one end of which is connected to the other of the two connection nodes of the third capacitor, and an inductor connected to the other ends of the fourth and fifth capacitors.

17. The duplexer according to claim 10, wherein the resonant circuit includes an LC resonant circuit.

18. The duplexer according to claim 10, wherein a resonant frequency of the resonant circuit is within a pass band of the transmission filter.

\* \* \* \* \*